United States Patent
Fukada (10) Patent No.: US 6,958,293 B2
(45) Date of Patent: Oct. 25, 2005

(54) METHOD FOR MANUFACTURING SEMICONDUCTOR DEVICE

(75) Inventor: Shinichi Fukada, Hamura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/849,148

(22) Filed: May 20, 2004

(65) Prior Publication Data

US 2005/0003563 A1 Jan. 6, 2005

(30) Foreign Application Priority Data

May 28, 2003 (JP) ........................................ 2003-151170

(51) Int. Cl.[7] .............................................. H01I 21/44
(52) U.S. Cl. ...................................... 438/680; 438/692
(58) Field of Search ............................... 438/680, 706, 438/692, 745, 673, 735

(56) References Cited

U.S. PATENT DOCUMENTS

| | | | | |
|---|---|---|---|---|
| 6,773,929 B2 * | 8/2004 | Oh et al. | ........................ | 438/3 |
| 6,841,396 B2 * | 1/2005 | Celii et al. | ...................... | 438/3 |
| 6,841,919 B2 * | 1/2005 | Akahane et al. | ....... | 310/316.01 |

FOREIGN PATENT DOCUMENTS

| | | |
|---|---|---|
| JP | A 08-316430 | 11/1996 |
| JP | A 10-223855 | 8/1998 |
| JP | A 2001-015697 | 1/2001 |

OTHER PUBLICATIONS

Hayashi, Takahisa et al., "A Novel Stack Capacitor cell for High Density FeRAM Compatible with CMOS Logic", IEEE, 2002, Japan.

* cited by examiner

*Primary Examiner*—David Nhu
(74) *Attorney, Agent, or Firm*—Oliff & Berridge, PLC (57) ABSTRACT

The invention provides a method for manufacturing a semiconductor device by which product performance and working efficiency can be improved while increasing a capacitor area of cross-point FeRAM. By using a first mask formed on a lower electrode layer forming film, a lower electrode is formed and processed and the lower electrode 2A can be exposed on a first insulating layer. By using a second mask formed on an upper electrode supporting layer forming film, a ferroelectric layer and an upper electrode supporting layer can be formed and processed and the upper electrode supporting layer can be exposed on a second insulating layer.

7 Claims, 5 Drawing Sheets

FIG.5C
PRIOR ART

METHOD FOR MANUFACTURING SEMICONDUCTOR DEVICE

BACKGROUND OF THE INVENTION

1. Field of Invention

The present invention relates to a semiconductor device including a ferroelectric capacitor and a method for manufacturing the same.

2. Description of Related Art

In recent years, a cross-point FeRAM has drawn attention as a semiconductor device having ferroelectric capacitors. In the cross-point FeRAM, upper electrode layers are arrayed in columns and lower electrode layers are arrayed in rows so as to be laid out in a matrix, and a plurality of ferroelectric capacitors are provided at each intersection of the upper electrode layers and the lower electrode layers. See, for example, T. Hayashi et. al, "A Novel Stack Capacitor Cell for High Density FeRAM Compossible with CMOS Logic", IEDM (International Electron Devices Meeting), 2002, session 21.3.

Figure 5A:
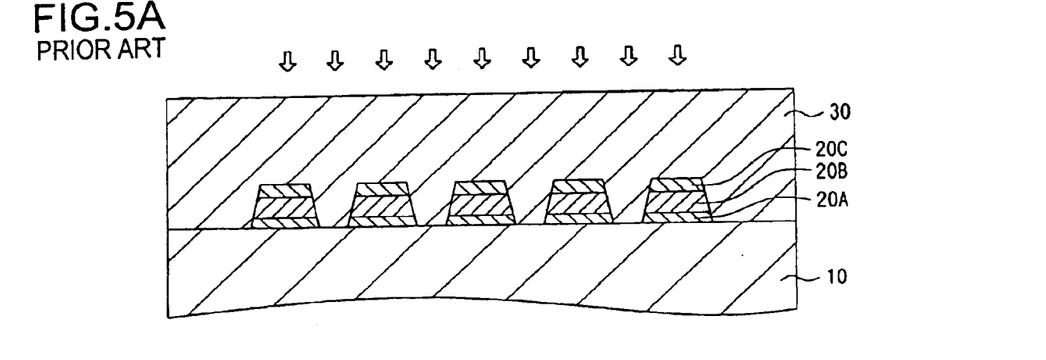
FIG. 5 is a sectional view illustrating steps of a conventional method for manufacturing a semiconductor device.
Figure 5B:
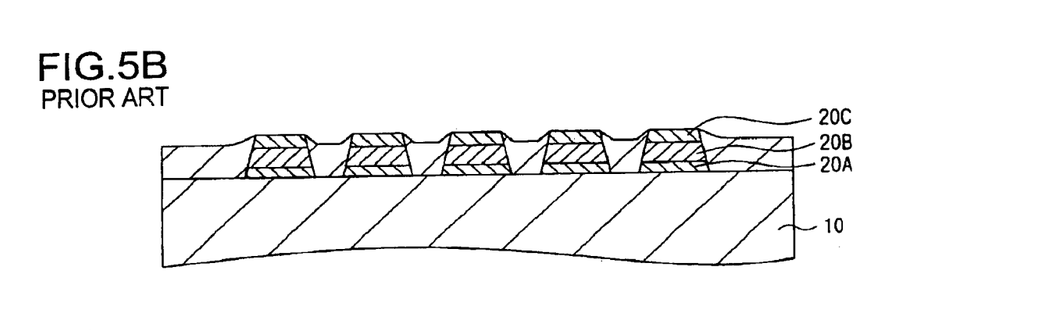
Figure 5C:
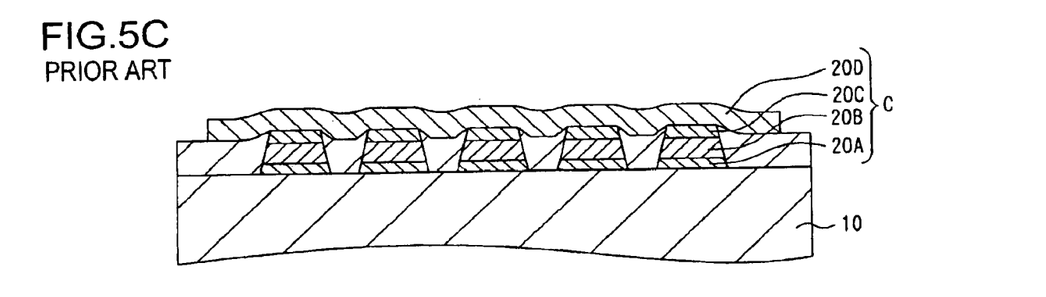

FIGS. 5A–5C show a sectional view illustrating steps of a conventional method for manufacturing a semiconductor device. Further, FIG. 5 is the sectional view taken along a long side of upper electrode layers arrayed in columns. As for a method for manufacturing the cross-point FeRAM, as shown in FIG. 5(A), an interlayer insulating layer 10 is formed by using a known chemical vapor deposition (CVD) on the whole upper surface of a semiconductor substrate (not shown in the drawing) on which a MOS transistor or the like have been provided.

Next, a lower electrode layer forming film (not shown in the drawing), a ferroelectric layer forming film (not shown in the drawing), and an upper electrode supporting layer forming film (not shown in the drawing) can be deposited in this order by using a known sputtering method on the interlayer insulating layer 10. Then, by using a known a photolithography and etching technique, a multilayer for forming a capacitor made up of a lower electrode layer 20A, a ferroelectric layer 20B, an upper electrode supporting layer 20C is provided in multiple numbers in rows in the regions where the lower electrode is formed.

Next, an insulating layer 30 is formed on the whole upper surface of the interlayer insulating layer 10, where the multilayer for forming a capacitor is provided in the regions where the lower electrode layer is formed, by using a known chemical vapor deposition (CVD) method.

Then, as shown in FIG. 5(B), an etching back performs on the whole surface of the insulating layer 30 so as to expose the upper surface of the upper electrode supporting layer 20C in the multilayer for forming a capacitor.

Next, an upper electrode layer forming film (not shown in the drawing) is formed on the whole surface of the insulating layer 30, where the upper surface of the upper electrode supporting layer 20C is exposed, by using a known sputtering method. Then, as shown in FIG. 5(C), by using a known a photolithography and etching technique, an upper electrode layer 20D is provided in multiple numbers in columns in the regions where the upper electrode is to be formed while remaining the upper electrode supporting layer 20C at least in the regions where the upper electrode is to be formed. Here, the etching is performed with a stop at the level of the upper surface of the lower electrode layer 20A. Thus, ferroelectric capacitors can be provided in multiple numbers and each provided at an intersection of the upper electrode layer 20D and the lower electrode layer 20A provided in mulitple numbers in a matrix.

SUMMARY OF THE INVENTION

In the above-mentioned method for manufacturing a cross-point FeRAM, the upper electrode supporting layer forming film, the ferroelectric layer forming film, and the lower electrode layer forming film are etched at once. This makes it difficult to process the three layers shaped correctly in vertical direction, and adversely affects the operational efficiency required for an etching.

Also, when etching for forming the lower electrode layer forming film, Platinum (Pt), a material for such forming is redeposited at the etched cross section. This may cause electrical short between the upper and the lower electrodes. In order to avoid it, the multilayer for forming a capacitor is required to be shaped so as to have a tapered cross section which is widened from the upper surface of the upper electrode supporting layer 20C to the under surface of the lower electrode layer. Therefore, an area of the upper electrode supporting layer 20C becomes smaller than that of the lower electrode layer 20A. As a result, this adversely affects the reduction of an effective area of the ferroelectric capacitor C formed only on a multilayered area of the upper electrode supporting layer 20C and the lower electrode layer 20A.

Also, in the above-mentioned method for manufacturing a cross-point FeRAM, the upper electrode supporting layer 20C can be exposed by an etching back on the whole upper surface of the insulating layer 30. Therefore, if a thickness of the insulating layer 30 or the etching back rate is not constant, this results in a different etching amount in one wafer or one chip, and induces a deterioration of the product performance.

Also, there is a possibility that the upper electrode supporting layer 20C is excessively etched depending on the thickness of the insulating layer 30 or the etching back rate. Therefore, this requires a limited etching back conditions, and adversely affects the operational efficiency required for the etching back.

The invention aims to provide a method for manufacturing a semiconductor device that is capable of improving the product performance and operational efficiency and increasing a capacitor area of the cross-point FeRAM. A method for manufacturing a semiconductor device of a first aspect of the invention can include a ferroelectric capacitor provided at an intersection of a lower electrode layer extending in a first direction and an upper electrode layer extending in a second direction. The method can include a step of depositing a lower electrode layer forming film on a semiconductor substrate, a step of depositing a lower electrode layer forming mask on the lower electrode layer forming film, a step of forming the lower electrode layer extending in the first direction by processing the lower electrode layer forming film with the lower electrode layer forming mask, a step of forming an insulating layer on the semiconductor substrate where the lower electrode layer has been formed in the presence of the lower electrode layer forming mask, a step of exposing an upper surface of the lower electrode layer forming mask by performing a planarization on the insulating layer, a step of removing the lower electrode layer forming mask that has been exposed so as to leave the insulating layer, and a step of depositing a ferroelectric layer forming film and an upper electrode layer forming film in this order on the insulating layer where the lower electrode layer forming mask has been removed.

Also, a method for manufacturing a semiconductor device of a second aspect of the invention can include a ferroelectric capacitor provided at an intersection of a lower electrode layer extending in a first direction and an upper electrode layer extending in a second direction. The method includes a step of depositing a ferroelectric layer forming film and an upper electrode supporting layer forming film in this order on a semiconductor substrate where the lower electrode layer extending in the first direction has been formed, a step of depositing an upper electrode supporting layer forming mask on the upper electrode supporting layer forming film, a step of forming an upper electrode supporting layer above the lower electrode layer that is at least to be the region where the ferroelectric capacitor is formed by processing the upper electrode supporting layer forming film with the upper electrode supporting layer forming mask, a step of forming an insulating layer on the semiconductor substrate where the upper electrode supporting layer has been formed in the presence of the upper electrode layer forming mask, a step of exposing an upper surface of the upper electrode supporting layer forming mask by performing a planarization on the insulating layer, a step of removing the upper electrode supporting layer forming mask that has been exposed so as to leave the insulating layer, a step of depositing an upper electrode layer forming film on the insulating layer where the upper electrode layer forming mask has been removed, and a step of forming the upper electrode layer extending in the second direction on the insulating layer including the region where the ferroelectric capacitor is formed by processing the upper electrode layer forming film.

Also, a method for manufacturing a semiconductor device of a third aspect of the invention can include a ferroelectric capacitor provided at an intersection of a lower electrode layer extending in a first direction and an upper electrode layer extending in a second direction. The method can include a step of depositing a lower electrode layer forming film on a semiconductor substrate, a step of depositing a lower electrode layer forming mask on the lower electrode layer forming film, a step of forming the lower electrode layer extending in the first direction by processing the lower electrode layer forming film with the lower electrode layer forming mask, a step of forming an first insulating layer on the semiconductor substrate where the lower electrode layer has been formed in the presence of the lower electrode layer forming mask, a step of exposing an upper surface of the lower electrode layer forming mask by performing a planarization on the first insulating layer, a step of removing the lower electrode layer forming mask that has been exposed so as to leave the first insulating layer, a step of depositing a ferroelectric layer forming film and an upper electrode supporting layer forming film in this order on the first insulating layer where the lower electrode layer forming mask has been removed, and a step of depositing an upper electrode supporting layer forming mask on the upper electrode supporting layer forming film, a step of forming an upper electrode supporting layer above the lower electrode layer that is at least to be the region where the ferroelectric capacitor is formed by processing the upper electrode supporting layer forming film with the upper electrode supporting layer forming mask, and a step of forming an second insulating layer on the semiconductor substrate where the upper electrode supporting layer has been formed in the presence of the upper electrode layer forming mask. The method can further include a step of exposing an upper surface of the upper electrode supporting layer forming mask by performing a planarization on the second insulating layer, and a step of removing the upper electrode supporting layer forming mask that has been exposed so as to leave the second insulating layer, and a step of forming an upper electrode layer forming film on the second insulating layer where the upper electrode layer forming mask has been removed, a step of forming the upper electrode layer extending in the second direction on the second insulating layer including the region where the ferroelectric capacitor is formed by processing the upper electrode layer forming film.

Also, a method for manufacturing a semiconductor device of the first and the third aspect of the invention, can further include a step of performing at least any one of an etching back and an etching on the insulating layer where the lower electrode supporting layer forming mask has been removed.

Also, a method for manufacturing a semiconductor device of the invention, can also have a step of performing at least any one of an etching back and an etching on the insulating layer where the upper electrode supporting layer forming mask has been removed.

In a method for manufacturing a semiconductor device of the first and third aspect of the invention, a material for forming the lower electrode layer forming mask can be required to have a robustness even buried in the insulating layer, though not limited to the specified. There is a hard mask material of which reactivity to the resist materials is different from that to a material for the insulating layer. For example, a ceramics, such as silicon oxide film, silicon nitride film, and metal film, such as a titanium nitride and a tungsten film.

In a method for manufacturing a semiconductor device of the second and third aspect of the invention, materials to form the lower electrode layer forming mask require a characteristic of no influences to the insulating layer, even though the materials are not limited to a specified. Examples include a ceramics, such as silicon oxide film, silicon nitride film, and metal film, such as a titanium nitride film and a tungsten film, namely a hard mask material that is differentially reactive to the resist materials and insulating layer forming materials According to a method for manufacturing a semiconductor device of the first aspect of the invention, the lower electrode layer can be separately formed and the lower electrode can be exposed by using the lower electrode layer forming mask pattern that was used for forming and processing of the lower electrode layer. Therefore, this makes it possible to increase accuracy in processing the ferroelectric capacitor as well as suppress the excess etching on the lower electrode layer. As a result, it is possible to provide a small configuration of the ferroelectric capacitor and improve the signal to noise ratio.

According to a method for manufacturing a semiconductor device of the second aspect of the invention, the lower electrode layer can be separately formed, and the upper electrode can be exposed by using the ferroelectric layer deposited on the lower electrode layer and the upper electrode layer forming mask pattern that was used for forming and processing of the upper electrode layer. Therefore, this makes it possible to increase accuracy in processing the ferroelectric capacitor, as well as suppress the excess etching on the lower electrode layer. As a result, it is possible to provide a small configuration of the ferroelectric capacitor and improve signal to noise ratio.

According to a method for manufacturing a semiconductor device of the third aspect of the invention, by performing both the method for manufacturing a semiconductor device of the first and second aspect of the invention, accuracy in processing the ferroelectric capacitor can be increased. As a result, it is possible to provide a small configuration of the ferroelectric capacitor and improve signal to noise ratio.

According to a method for manufacturing a semiconductor device of any of the first through the third aspect of the invention, the lower electrode layer can be separately formed and the ferroelectric layer, the upper electrode supporting layer or the upper electrode layer can be formed and processed on the lower electrode layer as subsequent processes. Accordingly, problems caused by a redeposition of the lower electrode layer forming material, which is concerned about a conventional method that three layers are processed at once, can be solved. Thus, a performance of the semiconductor device can be improved because an electrical short between the upper and lower electrodes of the ferroelectric capacitor can be suppressed. Also, the ferroelectric capacitor can be formed vertically from upper surface of the upper electrode supporting layer toward the under surface of the lower electrode layer so as to make the upper surface area of the upper electrode supporting layer and the lower electrode layer nearly the same. This makes it possible to increase an effective area of the ferroelectric capacitor.

According to a method for manufacturing a semiconductor device of any of the first through the third aspect of the invention, the lower electrode layer and the upper electrode supporting layer can be exposed by using the lower electrode forming mask and the upper electrode supporting layer forming mask respectively. This makes it possible to expose the lower electrode layer and the upper electrode supporting layer easily and firmly without any damages on the lower electrode layer and the upper electrode supporting layer. Therefore, it is possible to improve the product performance of the semiconductor device as well as improving an operation efficiency of the semiconductor device manufacturing processes.

According to a method for manufacturing a semiconductor device of the first or the third aspect of the invention, can further include a step of performing an etching back or etching on the insulating layer (a first insulating layer) where the lower electrode layer forming mask has been removed and an opening has been formed, the edge of the opening formed in the insulating layer (the first insulating layer) is rounded off. Accordingly, this can serve a good coverage of the ferroelectric layer forming film formed on the whole upper surface of the insulating layer (the first insulating layer) where the lower electrode layer has been exposed. As a result, the lower electrode layer and the ferroelectric layer are connected firmly. This eventually makes it possible to improve product performance of the semiconductor device.

Similarly, in a method for manufacturing a semiconductor device of the second or the third aspect of the invention, can also have a step of performing an etching back or etching on the insulating layer (a first insulating layer) where the upper electrode supporting layer forming mask has been removed and an opening has been formed, the edge of the opening formed in the insulating layer (the first insulating layer) is rounded off. Accordingly, this can serve a good coverage of the ferroelectric layer forming film formed on the whole upper surface of the insulating layer (the first insulating layer) where the lower electrode layer has been exposed. As a result, the lower electrode layer and the ferroelectric layer are connected firmly. This eventually makes it possible to improve product performance of the semiconductor device.

BRIEF DESCRIPTION OF THE DRAWINGS

The invention will be described with reference to the accompanying drawings, wherein like numerals reference like elements, and wherein:

FIG. 2 illustrates the semiconductor device shown in FIG. 1, where

DETAILED DESCRIPTION OF PREFERRED EMBODIMENTS

Embodiments of the invention will now be described with reference to the accompanying drawings.

Figure 1:
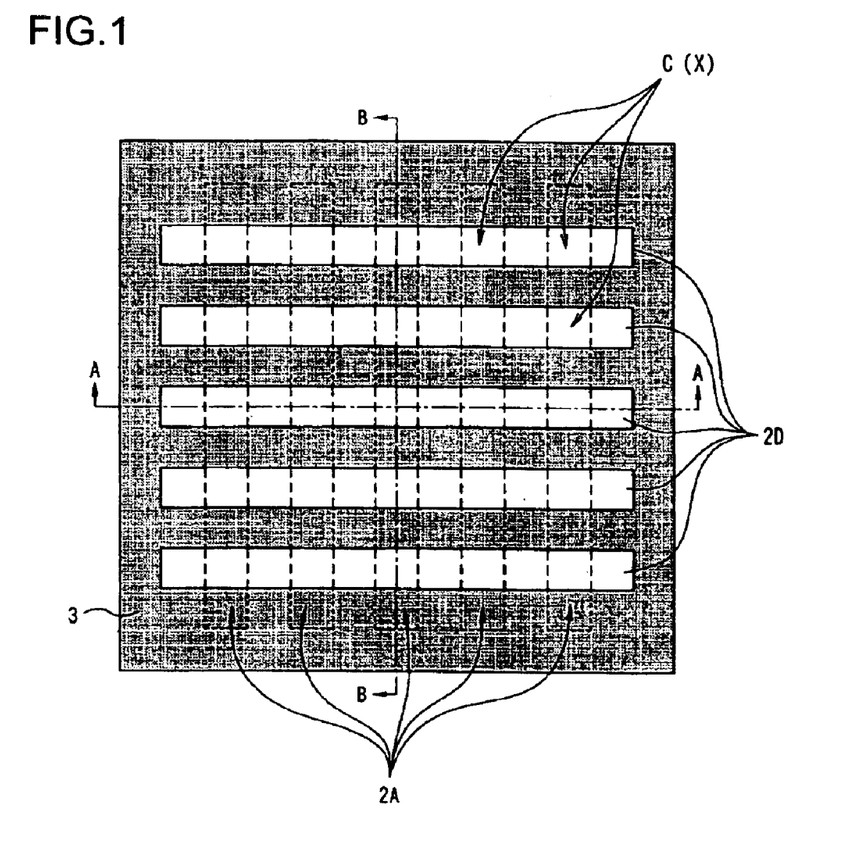
FIG. 1 is a plan view showing a configuration example of a semiconductor device of the invention.
Figure 2A:
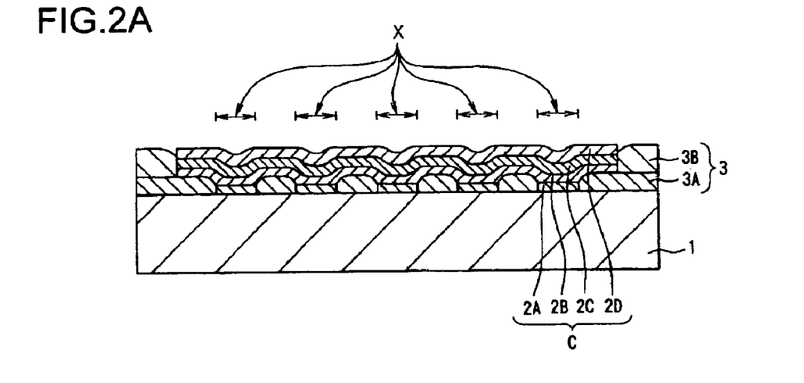
FIG. 2(a) is a sectional view taken along line 1A—1A in FIG. 1.
Figure 2B:
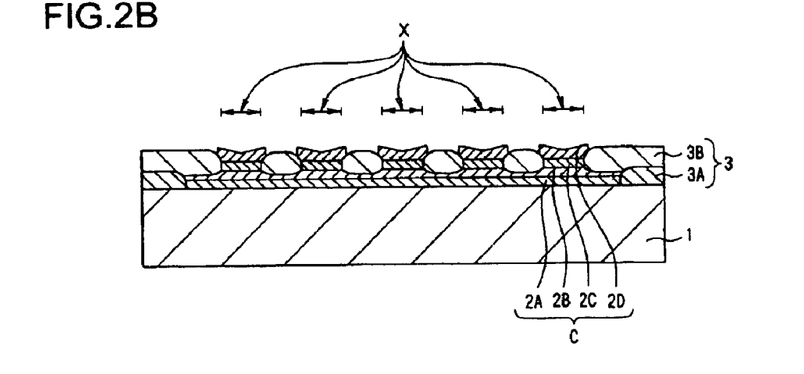
FIG. 2(b) is a sectional view taken along line 1B—1B in FIG. 1.

FIG. 1 is a plan view showing a configuration example of a semiconductor device of the invention. FIG. 2 illustrates the semiconductor device shown in FIG. 1. FIG. 2(a) is a sectional view taken along line A—A in FIG. 1. FIG. 2(b) is a sectional view taken along line B—B in FIG. 1.

A semiconductor device of this embodiment, as shown in FIG. 1, has a cross-point FeRAM including a ferroelectric capacitor C provided in multiple numbers, each provided at an intersection of a lower electrode layer 2A provided in row and an upper electrode layer 2D provided in column on a semiconductor substrate (not shown in the drawing) and a MOS transistor (not shown in the drawing) connected with a part of the ferroelectric capacitor C.

The ferroelectric capacitor C, as shown in FIG. 2, is made of the lower electrode layer 2A, a feroelectric layer 2B, an upper electrode supporting layer 2C, and the upper electrode layer 2D, which are deposited in this order on an interlayer insulating layer 1 formed on the semiconductor substrate (not shown in the drawing).

An insulating layer 3 that is made of a first insulating layer 3A and a second insulating layer 3B is provided under the upper electrode layer 2D provided in columns excluding the region X for forming the ferroelectric capacitor C through the upper electrode supporting layer 2C and the feroelectric layer 2B, as shown in FIG. 2(a). Meanwhile, the insulating layer 3, that is made of a first insulating layer 3A and a second insulating layer 3B is provided on the lower electrode layer 2A provided in rows excluding the region X for forming the ferroelectric capacitor C through the feroelectric layer 2B, as shown in FIG. 2(b).

A method for manufacturing the semiconductor device of this embodiment will now be described. FIG. 3 is a sectional view illustrating steps of the method for manufacturing the semiconductor device according to the embodiment. FIG. 4 is a sectional view illustrating steps of the method for manufacturing the semiconductor device from processes shown in FIG. 3 onward. Here, FIG. 3 is a sectional view in each process taken along line A—A of the semiconductor device shown in FIG. 1. Also, FIG. 4 is a sectional view in each process taken along line B—B of the semiconductor device shown in FIG. 1.

According to the method for manufacturing the semiconductor device of this embodiment, the interlayer insulating layer 1 that is made of, for example, a silicon oxide layer is deposited to be 1500 nm thick on the whole upper surface of the semiconductor substrate, on which a MOS transistor has been provided, by using a known CVD method.

Figure 3A:
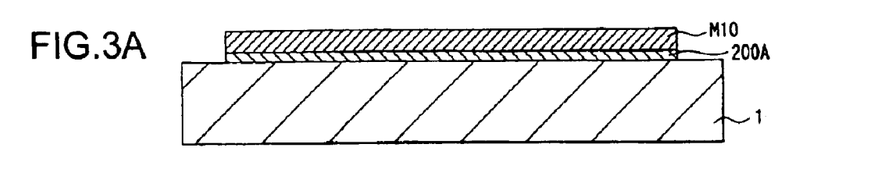
FIG. 3 is a sectional view illustrating steps of the method for manufacturing the semiconductor device according to the embodiment.

Next, as shown in FIG. 3(a), by using a known sputtering method for example, a lower electrode forming film 200A made of Pt or the like is deposited to be 200 nm thickness on the whole surface of the interlayer insulating layer 1. Then, by using a known sputtering method, a first film for forming a mask M10 made of a hard mask material, such as a titanium nitride film, and a tungsten film is deposited to be 300 nm thick on the whole surface of the lower electrode layer forming film 200A. Then, by using a known photolithography and etching technique, a first mask M1 (a lower electrode layer forming mask) is formed from the first film for forming a mask M10 so as to provide the lower electrode layer 2A in rows.

Figure 3B:
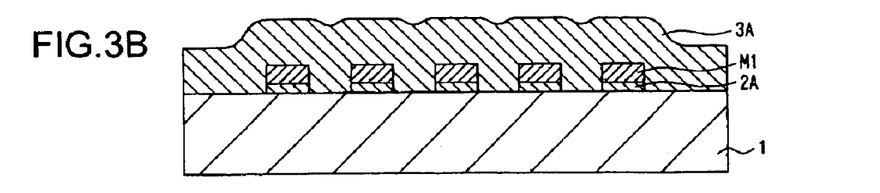

Next, as shown in FIG. 3(b), by using the first mask M1, an etching performs to the lower electrode forming film 200A so as to provide the lower electrode layer 2A in rows on the interlayer insulating layer 1.

Then, by using a known CVD method, the first insulating layer 3A that is made of, for example, a silicon oxide layer is deposited to be 1000 nm thick on the whole surface of the interlayer insulating layer 1 in the presence of the first mask M1 on the lower electrode layer 2A.

Figure 3C:
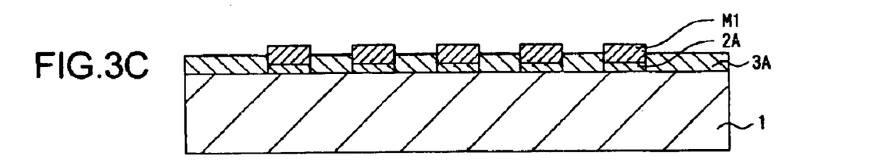

Next, a planarization by a known chemical mechanical polishing (CMP) method can be performed on the whole surface of the first insulating layer 1. Subsequently, an upper surface of the first a mask M1 exposes on the first insulating layer 3A by performing a CMP method or an etching back as shown in FIG. 3(c).

Figure 3D:
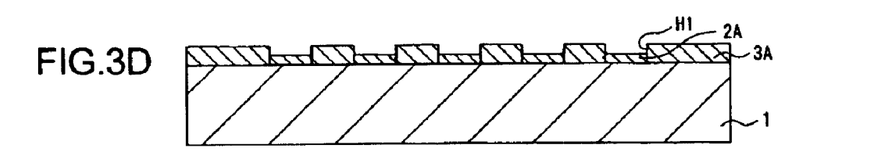

Then, as shown in FIG. 3(d), the first mask M1 formed on the lower electrode layer 2A can be removed by using a known technique so as to remain the first insulating layer 3A.

Figure 3E:
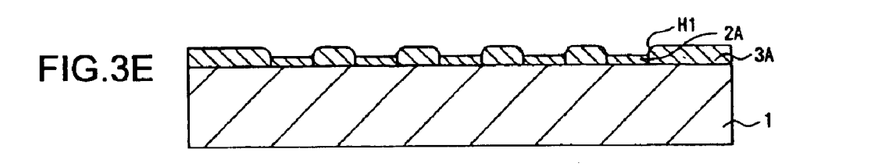

Next, as shown in FIG. 3(e), a known etching back or wet etching is performed on the whole surface of the first insulating layer 3A where the first mask M1 has been removed so as to round off an edge of an opening H1 that has been formed in the first insulating layer 3A as the result of the removal of the first mask M1.

As for the processing condition to round off the edge of the opening H1, an etching back performed by an isotropic dry etching using a gas containing rich inert gas, such as Ar in high pressure, can be utilized.

Figure 3F:
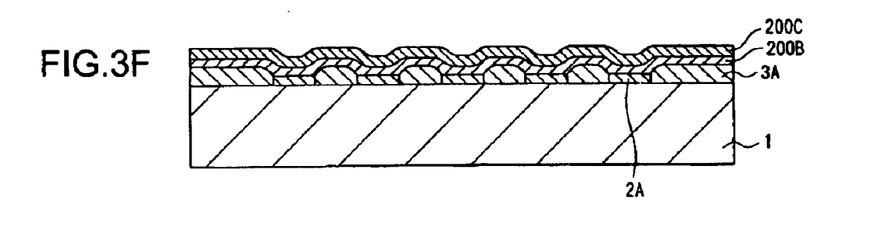

Next, as shown in FIG. 3(f), by using a known sputtering method, a ferroelectric layer forming film 200B made of SBT ($SrBi_2Ta_2O_9$), PZT ($Pb(Zr_xTi_{1-x})O_3$), or the like, and an upper electrode supporting layer forming film 200C made of Pt, or the like, are deposited in this order to make each of the film be 200 nm thick on the whole surface of the insulating layer 3A where the upper surface of the lower electrode layer 2A has been exposed.

Figure 4A:
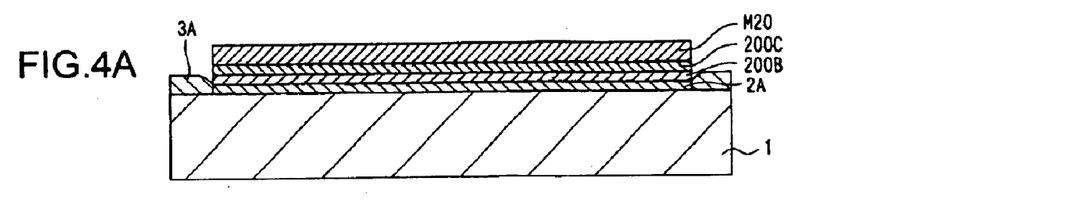
FIG. 4 is a sectional view illustrating steps of the method for manufacturing the semiconductor device according to the embodiment.

Next, as shown in FIG. 4(a), by using a known sputtering method, a second film for forming a mask M20 made of a hard mask material, such as a titanium nitride film and a tungsten film can be deposited to be 300 nm thick on the whole surface of the lower electrode supporting forming film 200C. Here, the lower electrode layer 2A, the ferroelectric layer forming film 200B and the upper electrode supporting forming film 200C have been deposited in this order on the regions where the upper electrode layer to be formed provided on the interlayer insulating layer 1 as shown in FIG. 3. Subsequently, by using a known photolithography and etching technique, a second mask M2 (an upper electrode supporting layer forming mask) can be formed from the second film for forming a mask M20 so as to provide the ferroelectric layer 2B and the upper electrode supporting layer 2C on the regions where the upper electrode layer is formed.

Figure 4B:
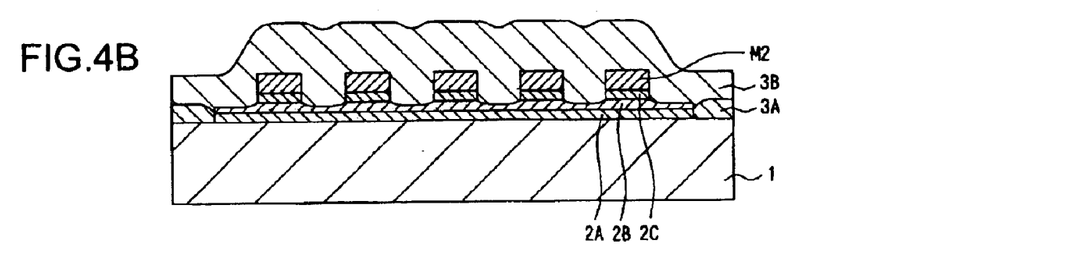

Next, as shown in FIG. 4(b), by using the second mask M2, an etching performs to at least the upper electrode supporting layer forming film 200C that is formed excluding the region where the upper electrode layer is formed so as to provide the feroelectric layer 2B and the upper electrode supporting layer 2C in this order on the lower electrode layer 2A that becomes the regions where the upper electrode layer to be formed. Here, the etching using the second mask M2 may perform to the ferroelectric layer forming film 200C excluding the regions where the upper electrode is to be formed so as to remain unremoved or remain half depth or remove it entirely, if the upper electrode supporting layer forming film 200C can be removed without removing the lower electrode layer 2A.

Next, by using a known CVD method, the second insulating layer 3B that is made of; for example, a silicon oxide layer is deposited to be 1000 nm thick on the whole surface of the interlayer insulating layer 1 in the presence of the first mask M2 on the upper electrode supporting layer 2C.

Figure 4C:
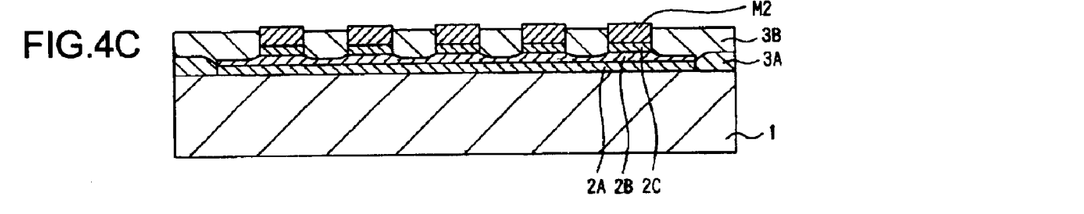

Then, as shown in FIG. 4(c), a planarization by a known chemical mechanical polishing (CMP) method is performed on the whole surface of the first insulating layer 1. Subsequently, an upper surface of the second mask M2 exposes on the second insulating layer 3B by performing a CMP method or an etching back.

Figure 4D:
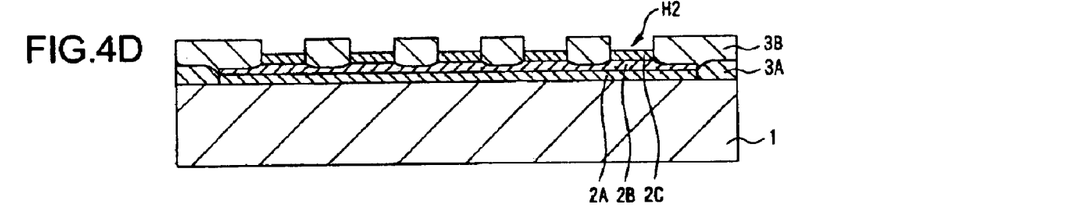

Next, as shown in FIG. 4(d), the second mask M2 formed on the upper electrode supporting layer 2C is removed by using a known technique so as to remain the second insulating layer 3B.

Figure 4E:
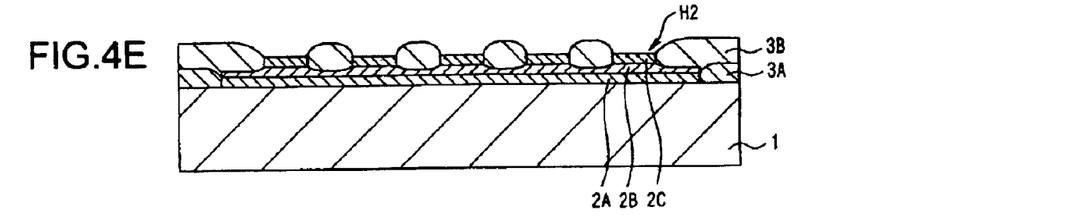

Then, as shown in FIG. 4(e), a known etching back or wet etching is performed on the whole surface of the second insulating layer 3B so as to round off an edge of an opening H2 performed in the second insulating layer 3B where the second mask M2 has been removed.

Next, by using a known sputtering method, an upper electrode layer forming film (not shown in the drawing) made of Pt is deposited on the whole upper surface of the second insulating layer 3B where the upper surface of the upper electrode supporting layer 2C is exposed. Then, as shown in FIG. 2, by using a known a photolithography and etching technique, an upper electrode 2D is provided in multiple numbers in columns in the regions where the upper electrode is to be provided and the ferroelectric layer 2B and the upper electrode supporting layer 2C have been provided.

Thus, the upper electrode layer 2D provided in multiple numbers and the lower electrode layer 2A provided in multiple numbers form a matrix. Each intersection of the matrix defines the region X for forming a ferroelectric capacitor, in which a ferroelectric capacitor C is provided. Thus the ferroelectric capacitor C is provided in multiple numbers in the matrix.

Subsequently, the upper electrode layer 2D, the lower electrode layer 2A and the MOS transistor are connected so as to form a peripheral circuitry, which completes a semiconductor device performing as a cross-point FeRAM. The cross-point FeRAM can perform read and write to the ferroelectric capacitor provided at the intersection by selecting the upper electrode layer 2D and the lower electrode layer 2A respectively through the peripheral circuitry.

According to the method for manufacturing the semiconductor device of the embodiment, a processing accuracy of the ferroelectric capacitor can be improved because the processing and processing of the lower electrode layer 2A, the ferroelectric layer 2B, and the upper electrode supporting layer 2C are performed in steps different from one another. As a result, a signal to noise ratio of the ferroelectric capacitor can be improved.

Similarly, because the forming and processing of the lower electrode layer 2A, the ferroelectric layer 2B, and the upper electrode supporting layer 2C are performed in steps different from one another, problems caused by a redeposition of a lower electrode layer 2A forming material, which is concerned about a conventional method, which the processing of the lower electrode layer forming film 200A, the ferroelectric layer forming film 200B, and the upper electrode supporting layer forming film 200C are formed and processed at once, can be solved. Thus, a performance of the semiconductor device can be improved because an electrical short between the upper and lower electrodes of the ferroelectric capacitor C can be suppressed. Also, the ferroelectric capacitor C can be formed vertically from upper surface of the upper electrode supporting layer 2C toward the lower surface of the lower electrode layer 2A so as to make the upper surface area of the upper electrode supporting layer 2C and the lower electrode layer 2A nearly the same. This makes it possible to increase an effective area of the ferroelectric capacitor C.

According to the method for manufacturing the semiconductor device of the embodiment, the first insulating layer 3A can be provided in the presence of the first mask M1 on the lower electrode layer 2A. By removing the first mask M1 after the exposure of the upper surface of the mask M1 from the upper surface of the first insulating layer 3A, the lower electrode layer 2A can expose easily from the upper surface of the first insulating layer 3A without any damages on the lower electrode layer 2A. Therefore, it is possible to improve the performance of the semiconductor device, as well as improving a working efficiency of the semiconductor device manufacturing processes.

Similarly, the second insulating layer 3B can be provided in the presence of the second mask M2 on the upper electrode supporting layer 2C. By removing the second mask M2 after the exposure of the upper surface of the mask M2 from the upper surface of the second insulating layer 3B, the upper electrode supporting layer 2C can expose easily from the upper surface of the second insulating layer 3B without any damages on the upper electrode support layer 2C. Therefore, it is possible to improve the performance of the semiconductor device, as well as improving a working efficiency of the semiconductor device manufacturing processes.

Also, according to the method for manufacturing the semiconductor device of the embodiment, since an etching back or etching is performed on the first insulating layer 3A where the first mask M1 has been removed, the edge of the opening H1 that is formed in the first insulating layer 3A as the result of the removal of the first mask M1 is rounded off. Accordingly, this can serve a good coverage of the feroelectric layer forming film 200B formed on the whole upper surface of the first insulating layer 3A where the lower electrode 2A has been exposed. As a result, the lower electrode layer 2A and the ferroelectric layer 2B are connected firmly. This eventually makes it possible to improve product performance of the semiconductor device.

Similarly, since an etching back or etching is performed on the second insulating layer 3B where the second mask M2 has been removed, the edge of the opening H2 that is formed in the second insulating layer 3B as the result of the removal of the second mask M2 is rounded off. Accordingly, this can serve a good coverage of the upper electrode layer forming film formed on the whole upper surface of the second insulating layer 3B where the upper electrode supporting layer 2C has been exposed. As a result, the upper electrode support layer 2C and the upper electrode layer 2D are connected firmly. This eventually makes it possible to improve product performance of the semiconductor device.

While it is supposed that a MOS transistor is coupled to the ferroelectric capacitor C in this embodiment, it should be understood that any other semiconductor devices may replace the MOS transistor as far as they can be coupled to the ferroelectric capacitor C. Examples of such devices may include other metal insulator semiconductor (MIS) transistors, such as a metal oxide metal nitride oxides semiconductor (MONOS) transistor.

Also, while the first mask (lower electrode layer forming mask) M1 is used in the process that the lower electrode layer exposes on the first insulating layer 3A and the second mask (upper electrode supporting layer forming mask) M2 is used in the process that the upper electrode supporting layer 2C exposes on the second insulating layer 3B in this embodiment, it should be understood that the invention is not limited to this. The invention may apply for either process.

What is claimed is:

1. A method for manufacturing a semiconductor device that includes a ferroelectric capacitor provided at an intersection of a lower electrode layer extending in a first direction and an upper electrode layer extending in a second direction, the method comprising:

depositing a lower electrode layer forming film on a semiconductor substrate;

depositing a lower electrode layer forming mask on the lower electrode layer forming film;

forming the lower electrode layer extending in the first direction by processing the lower electrode layer forming film with the lower electrode layer forming mask;

forming an insulating layer on the semiconductor substrate where the lower electrode layer has been formed in the presence of the lower electrode layer forming mask;

exposing an upper surface of the lower electrode layer forming mask by performing a planarization on the insulating layer;

removing the lower electrode layer forming mask that has been exposed so as to leave the insulating layer; and depositing a ferroelectric layer forming film and an upper electrode layer forming film in this order on the insulating layer where the lower electrode layer forming mask has been removed.

2. A method for manufacturing a semiconductor device that includes a ferroelectric capacitor provided at an intersection of a lower electrode layer extending in a first direction and an upper electrode layer extending in a second direction, the method comprising:

depositing a ferroelectric layer forming film and an upper electrode supporting layer forming film in this order on a semiconductor substrate where the lower electrode layer extending in the first direction has been formed;

depositing an upper electrode supporting layer forming mask on the upper electrode supporting layer forming film;

forming an upper electrode supporting layer above the lower electrode layer that is at least to be a region where the ferroelectric capacitor is formed by processing the upper electrode supporting layer forming film with the upper electrode supporting layer forming mask;

forming an insulating layer on the semiconductor substrate where the upper electrode supporting layer has been formed in the presence of the upper electrode layer forming mask;

exposing an upper surface of the upper electrode supporting layer forming mask by performing a planarization on the insulating layer;

removing the upper electrode supporting layer forming mask that has been exposed so as to leave the insulating layer;

depositing an upper electrode layer forming film on the insulating layer where the upper electrode layer forming mask has been removed; and forming the upper electrode layer extending in the second direction on the insulating layer including the region where the ferroelectric capacitor is formed by processing the upper electrode layer forming film.

3. A method for manufacturing a semiconductor device that includes a ferroelectric capacitor provided at an intersection of a lower electrode layer extending in a first direction and an upper electrode layer extending in a second direction, the method comprising:

depositing a lower electrode layer forming film on a semiconductor substrate;

depositing a lower electrode layer forming mask on the lower electrode layer forming film;

forming the lower electrode layer extending in the first direction by processing the lower electrode layer forming film with the lower electrode layer forming mask;

forming a first insulating layer on the semiconductor substrate where the lower electrode layer has been formed in the presence of the lower electrode layer forming mask;

exposing an upper surface of the lower electrode layer forming mask by performing a planarization on the first insulating layer;

removing the lower electrode layer forming mask that has been exposed so as to leave the first insulating layer;

depositing a ferroelectric layer forming film and an upper electrode supporting layer forming film in this order on the first insulating layer where the lower electrode layer forming mask has been removed;

depositing an upper electrode supporting layer forming mask on the upper electrode supporting layer forming film;

forming an upper electrode supporting layer above the lower electrode layer that is at least to be a region where the ferroelectric capacitor is formed by processing the upper electrode supporting layer forming film with the upper electrode supporting layer forming mask;

forming a second insulating layer on the semiconductor substrate where the upper electrode supporting layer has been formed in the presence of the upper electrode layer forming mask;

exposing an upper surface of the upper electrode supporting layer forming mask by performing a planarization on the second insulating layer;

removing the upper electrode supporting layer forming mask that has been exposed so as to leave the second insulating layer;

forming an upper electrode layer forming film on the second insulating layer where the upper electrode layer forming mask has been removed;

forming the upper electrode layer extending in the second direction on the second insulating layer including the region where the ferroelectric capacitor is formed by processing the upper electrode layer forming film.

4. The method of manufacturing a semiconductor device according to claim 1, further comprising;

performing at least one of an etching back and an etching on the insulating layer where the lower electrode supporting layer forming mask has been removed.

5. The method of manufacturing a semiconductor device according to claim 2, further comprising;

performing at least one of an etching back and an etching on the insulating layer where the upper electrode supporting layer forming mask has been removed.

6. The method of manufacturing a semiconductor device according to claim 3, further comprising;

performing at least one of an etching back and an etching on the insulating layer where the lower electrode supporting layer forming mask has been removed.

7. The method of manufacturing a semiconductor device according to claim 3, further comprising;

performing at least one of an etching back and an etching on the insulating layer where the upper electrode supporting layer forming mask has been removed.

* * * * *